(12) United States Patent
Michael

(10) Patent No.: US 8,045,659 B2
(45) Date of Patent: Oct. 25, 2011

(54) OFDM RECEIVER AND ITS AUTOMATIC GAIN CONTROL CIRCUIT

(75) Inventor: Lachlan Bruce Michael, Saitama (JP)

(73) Assignee: Sony Corporation, Tokyo (JP)

( * ) Notice: Subject to any disclaimer, the term of this patent is extended or adjusted under 35 U.S.C. 154(b) by 1221 days.

(21) Appl. No.: 11/737,546

(22) Filed: Apr. 19, 2007

(65) Prior Publication Data
US 2007/0248177 A1     Oct. 25, 2007

(30) Foreign Application Priority Data

Apr. 21, 2006   (JP) ............................... P2006-118319

(51) Int. Cl.
    *H04L 27/08*   (2006.01)
    *H04B 1/06*    (2006.01)
(52) U.S. Cl. .................................... 375/345; 455/232.1
(58) Field of Classification Search .................. 375/316,
    375/345; 455/91, 127.1, 127.2, 218, 219,
    455/130, 230, 232.1; 370/203, 210
    See application file for complete search history.

(56) References Cited

U.S. PATENT DOCUMENTS

| | | | |
|---|---|---|---|
| 5,563,916 A | 10/1996 | Scarpa | |
| 6,081,565 A | 6/2000 | Marandi et al. | |
| 6,259,391 B1 | 7/2001 | Pakravan et al. | |
| 6,292,120 B1 | 9/2001 | Painchaud et al. | |
| 6,668,027 B1 | 12/2003 | Scarpa | |
| 2003/0194029 A1 | 10/2003 | Heinonen et al. | |
| 2004/0130470 A1 | 7/2004 | Gregoire | |
| 2006/0014507 A1 | 1/2006 | Giancola et al. | |

FOREIGN PATENT DOCUMENTS

| | | |
|---|---|---|
| EP | 1 061 653 | 12/2000 |
| EP | 1 363 403 | 11/2003 |
| EP | 1 439 636 | 7/2004 |
| GB | 2 369 258 | 5/2002 |

*Primary Examiner* — Dac Ha
*Assistant Examiner* — Vineeta Panwalkar
(74) *Attorney, Agent, or Firm* — Finnegan, Henderson, Farabow, Garrett & Dunner, L.L.P.

(57) ABSTRACT

An OFDM receiver includes: a variable gain amplifier controlling a signal level of an intermediate frequency signal that is obtained from a reception signal by frequency-conversion; and an automatic gain controller controlling a gain of the variable gain amplifier means. The automatic gain controller includes: a clip detector comparing a clip number threshold value with a detected number of transient clips in which a signal level of the intermediate frequency signal exceeds a parameter clip level, so as to detect a period where the detected number exceeds the clip number threshold value; an accumulator accumulating a detection output of the clip detector; and a target value decision circuit to which an accumulation output of the accumulator is supplied.

7 Claims, 10 Drawing Sheets

INPUT TO ADC (AWGN CHANNEL SNR=30dB), 1 FRAME

HISTOGRAM OF INPUT TO ADC (AWGN CHANNEL SNR=30dB), 1 FRAME

INPUT TO ADC (1 PATH RAYLEIGH CHANNEL =50Hz),1 FRAME

INPUT TO ADC (1 PATH RAYLEIGH CHANNEL =50Hz),1 FRAME

OFDM RECEIVER AND ITS AUTOMATIC GAIN CONTROL CIRCUIT

BACKGROUND OF THE INVENTION

1. Field of the Invention

The present invention relates to an orthogonal frequency division multiplexing (OFDM) receiver for receiving and demodulating an OFDM signal and its automatic gain controller circuit.

2. Description of Related Art

In recent years, a modulation method called an orthogonal frequency division multiplexing method (hereinafter referred to as an OFDM method) is known as a method of modulating digital data. With this OFDM modulation method, a number of orthogonal subcarriers is provided in a transmission band, and digital data is assigned to the amplitude and phase of each subcarrier by phase shift keying (PSK) or quadrature amplitude modulation (QAM) to modulate the digital data.

Since the OFDM method divides the transmission band by a number of subcarriers, the band per one subcarrier becomes narrower and a modulation speed lowers. However, it has a feature such that a total transmission speed is not different from that of a modulation method of current related art. Since the OFDM method transmits a number of subcarriers in parallel, a symbol speed becomes lowers, thereby enabling to shorten a relative time length of a multipath with respect to a time length of a symbol. It has therefore another feature of less susceptibility to multipath interference. Still another feature is such that since the OFDM method assigns data to a plurality of subcarriers, a transmission/reception circuit can be realized by using an Inverse Fast Fourier Transform (IFFT) calculation circuit for inverse Fourier transform during modulation and a Fast Fourier Transform (FFT) calculation circuit for Fourier transform during demodulation.

The OFDM method having these features are often applied to terrestrial digital broadcasting which is strongly influenced by multipath interference. For terrestrial digital broadcasting adopting the OFDM method, there are standards such as Digital Video Broadcasting-Terrestrial (DVB-T) and Integrated Services Digital Broadcasting-Terrestrial Sound Broadcasting (ISDB-TSB) (e.g., refer to "Terrestrial Digital Sound Broadcasting Receiver Standards (Desired Specification) ARIB STD-B30, ver. 1.1", Association of Radio Industries and Businesses, executed on May 31, 2001 and revised to 1.1 on Mar. 28, 2001, and "Transmission Method for Terrestrial Digital Sound Broadcasting ARIB STD-B29, ver. 1.1", Association of Radio Industries and Businesses, executed on May 31, 2001 and revised to 1.1 on Mar. 28, 2001.

In an OFDM receiver of related art, a tuner unit connected to an antenna converts an OFDM signal of a desired reception channel into an intermediate frequency (IF) signal which is then supplied to an intermediate frequency amplifier unit. The IF signal amplified by the intermediate frequency amplifier unit is converted into a digital signal by an A/D converter circuit, and the digital signal is supplied to a baseband processing unit. By using a carrier signal having a predetermined frequency (carrier frequency), the baseband processing unit orthogonally demodulates the digitized IF signal to obtain an OFDM time domain signal of the baseband. Only the effective symbol period of the OFDM time domain signal is subjected to FFT to obtain an OFDM frequency domain signal. The OFDM frequency domain signal is subjected to differential demodulation of DQPSK or synchronous demodulation of QPSK, 16 QAM or 64 QAM to obtain a demodulated output of the OFDM signal of the reception channel.

The baseband processing unit has therein an automatic gain controller (AGC) circuit which maintains constant the level of the intermediate frequency signal to be supplied to the A/D converter circuit by controlling the gain of a voltage controlled variable gain amplifier constituting the intermediate frequency amplifier unit.

For example, as shown in FIG. 8, an automatic gain controller circuit 510 of an OFDM receiver 500 of related art includes an absolute value (ABS) circuit 511, a subtractor circuit 512, a sign judgment (SGN) circuit 513, a low-pass filter 514, a rounding process (RIND) circuit 515, an accumulator circuit 516.

In this automatic gain controller circuit 510, the ABS circuit 511 obtains an absolute value of the signal level value of the intermediate frequency signal by removing the sign of the intermediate frequency signal digitized by and supplied from the A/D converter circuit 504. The subtractor circuit 512 subtracts a fixed target value from the signal level value of the intermediate frequency signal changed into the absolute signal level by the ABS circuit 511 to detect a signed difference value. The SGN circuit 513 judges the sign of the signed difference value detected by the subtractor circuit 512, and supplies a 1-bit sign signal corresponding to the sign of the difference value to the accumulator circuit 516 via the low-pass filter 514 and rounding process (RND) circuit 515. The accumulator circuit 516 outputs an accumulation output as an automatic gain controller (AGC) signal.

The AGC signal output from the automatic gain controller circuit 510 is supplied to a pulse density modulation (PDM) circuit 520 which outputs a PDM signal of a rectangular wave whose density changes with an amplitude of the AGC signal. The PDM signal is fed back via a low-pass filter 525 to a control terminal of a voltage controlled variable gain amplifier 503A constituting an intermediate frequency amplifier unit 503.

As described above, in the automatic gain controller circuit 510 of the OFDM receiver 500, the fixed target value is used as one of input parameters, and subtracted from the absolute value of the signal after A/D conversion. The sign of the resultant value is converted into a 1-bit signal. This signal is passed through the low-pass filter 514 and accumulated in the accumulator circuit 516 to obtain and output the AGC signal.

Input signals to the A/D converter circuit 504 of the OFDM receiver 500 have a property of a Gaussian distribution in an additive white Gaussian noise (AWGN) channel, as shown in FIGS. 9A and 9B. If a distribution of input signals is estimated and a fixed target value is used, a clip amount of the input signal can be adjusted. Adjusting noises by clipping and adjusting noises by quantization are properly balanced so that a quantity of noises mixed in the A/D converter circuit 504 can be minimized.

SUMMARY OF THE INVENTION

However, in the OFDM receiver 500 equipped with the automatic gain controller circuit 510 having the above-described structure, the property (distribution) of input signals in a mobile channel to the A/D converter circuit 504 shifts from a Gaussian distribution, as shown in FIGS. 10 and 11. FIGS. 10A and 10B show input signals (without AGC) and their distribution in a flutter channel, and FIGS. 11A and 11B show input signals (without AGC) and their distribution in a one-wave Rayleigh channel.

If a target value optimized in an AWGN channel is set, a large quantity of clipping occurs in a mobile channel so that the performance of a receiver is degraded. If a target is set for a mobile channel, quantization noises increases in an AWGN channel so that the performance of a receiver is degraded.

Accordingly, it is desirable to provide an orthogonal frequency division multiplexing (OFDM) receiver for receiving and demodulating an OFDM signal without clipping an input signal to an A/D converter circuit in a mobile channel (such as flutter, one-wave Rayleigh) while suppressing degradation. The present invention is made in view of the above-described circumstance.

Other objects and particular advantages of the present invention will become more apparent from the following description of embodiments.

In the present invention, an automatic gain controller (AGC) circuit of an OFDM receiver automatically controls a target value to an optimum value or substantially optimum value.

According to an embodiment of the present invention, there is provided an OFDM receiver for receiving and demodulating an orthogonal frequency division-multiplexing (OFDM) signal. The OFDM receiver includes: variable gain amplifier means for controlling a signal level of an intermediate frequency signal that is obtained from a reception signal by frequency-conversion; and an automatic gain controller circuit for controlling a gain of the variable gain amplifier means. The automatic gain controller circuit includes: clip detection means for comparing a clip number threshold value with a detected number of transient clips in which a signal level of the intermediate frequency signal that is obtained from a reception signal by frequency-conversion exceeds a parameter clip level, to detect a period where the detected number exceeds the clip number threshold value; accumulator means for accumulating a detection output of the clip detection means; and target value decision means to which an accumulation output of the accumulator means is supplied. The target value decision means includes: first comparison means for comparing the accumulation output of the accumulator means with a clip threshold value to judge if a clip occurs; and second comparison means for comparing the accumulation output of the accumulator means with a non-clip threshold value to judge whether clip does not occur. A target value for automatic gain control is adaptively determined by decreasing by a predetermined amount the target value in accordance with a comparison output of the first comparison means and by increasing by a predetermined amount the target value in accordance with a comparison output of the second comparison means.

According to another embodiment of the present invention, there is provided an automatic gain controller circuit in an OFDM receiver for receiving and demodulating an orthogonal frequency division-multiplexing (OFDM) signal. The automatic gain controller circuit includes: clip detection means for comparing a clip number threshold value with a detected number of transient clips in which a signal level of the intermediate frequency signal that is obtained from a reception signal by frequency-conversion exceeds a parameter clip level, to detect a period where the detected number exceeds the clip number threshold value; accumulator means for accumulating a detection output of the clip detection means; and target value decision means to which an accumulation output of the accumulator means is supplied. The target value decision means includes: first comparison means for comparing the accumulation output of the accumulator means with a clip threshold value to judge if a clip occurs; and second comparison means for comparing the accumulation output of the accumulator means with a non-clip threshold value to judge whether clip does not occur. A target value for automatic gain control is adaptively determined by decreasing by a predetermined amount the target value in accordance with a comparison output of the first comparison means and by increasing by a predetermined amount the target value in accordance with a comparison output of the second comparison means.

According to the embodiments of the present invention, the automatic gain controller (AGC) circuit of an OFDM receiver automatically controls a target value to an optimum value or a substantially optimum value. It is therefore possible not to clip an input signal for an A/D converter circuit in a mobile channel (such as flutter, one-wave Rayleigh), thereby suppressing degradation.

DETAILED DESCRIPTION OF EMBODIMENTS

Embodiments of the present invention will be described in detail with reference to the accompanying drawings.

Figure 1:
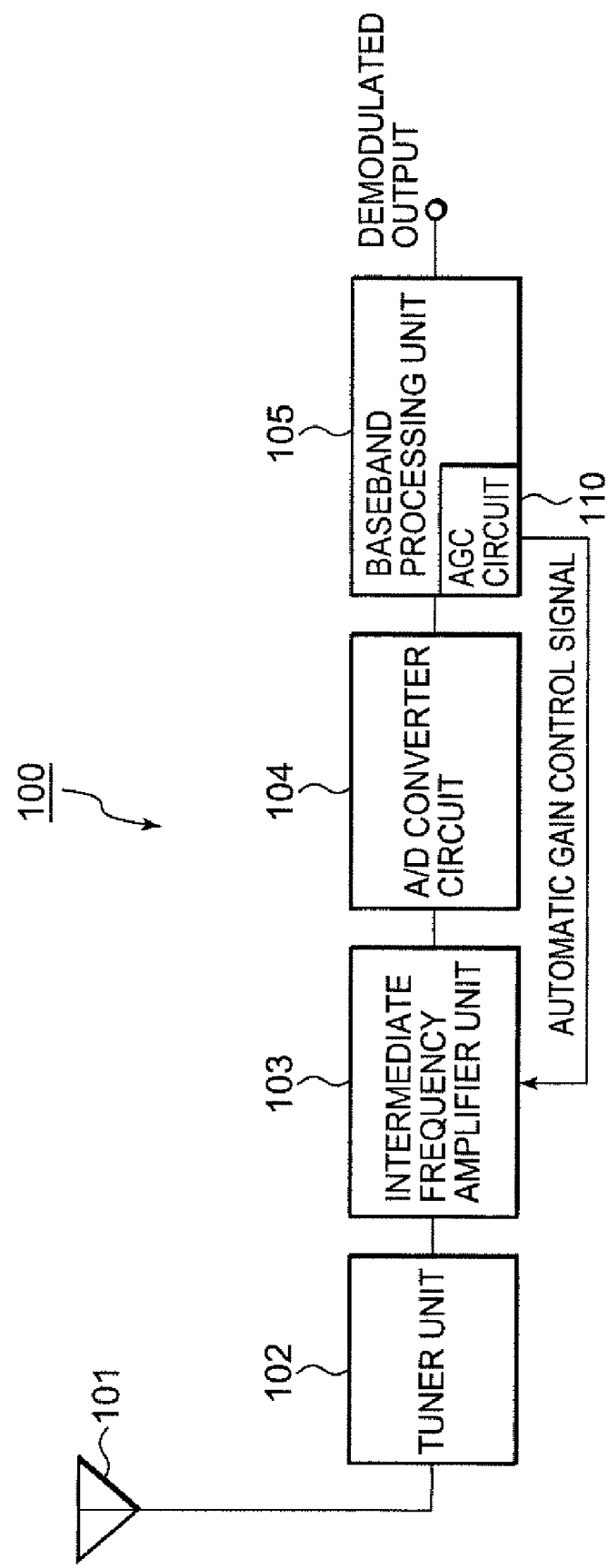
FIG. 1 is a block diagram showing a structure of an OFDM receiver according to an embodiment of the present invention.

An embodiment of the present invention is applied to an automatic gain controller circuit 110 of an OFDM receiver 100 having a structure such as shown in FIG. 1.

The OFDM receiver 100 includes a tuner unit 102 connected to an antenna 101, an intermediate frequency amplifier unit 103 to which an intermediate frequency (IF) signal converted from an OFDM signal of a desired reception channel by the tuner unit 102 is input, a baseband processing unit 105 to which the intermediate frequency signal amplified by the intermediate frequency amplifier unit 103 and digitized by an A/D converter circuit 104 is input.

By using a carrier signal having a predetermined frequency (carrier frequency), the baseband processing unit 105 orthogonally demodulates the digitized IF signal and obtains an OFDM time domain signal of the baseband. Only the effective symbol period of the OFDM time domain signal is subjected to FFT to obtain an OFDM frequency domain signal. The OFDM frequency domain signal is subjected to differential demodulation of DQPSK or synchronous demodulation of QPSK, 16 QAM or 64 QAM to obtain a demodulated output of the OFDM signal of the reception channel.

The baseband processing unit 105 contains therein an automatic gain controller (AGC) circuit 110 which maintains constant the level of the intermediate IF signal to be supplied to the A/D converter circuit 104, by controlling the gain of a voltage controlled variable gain amplifier constituting the intermediate frequency amplifier unit 103.

Figure 2:
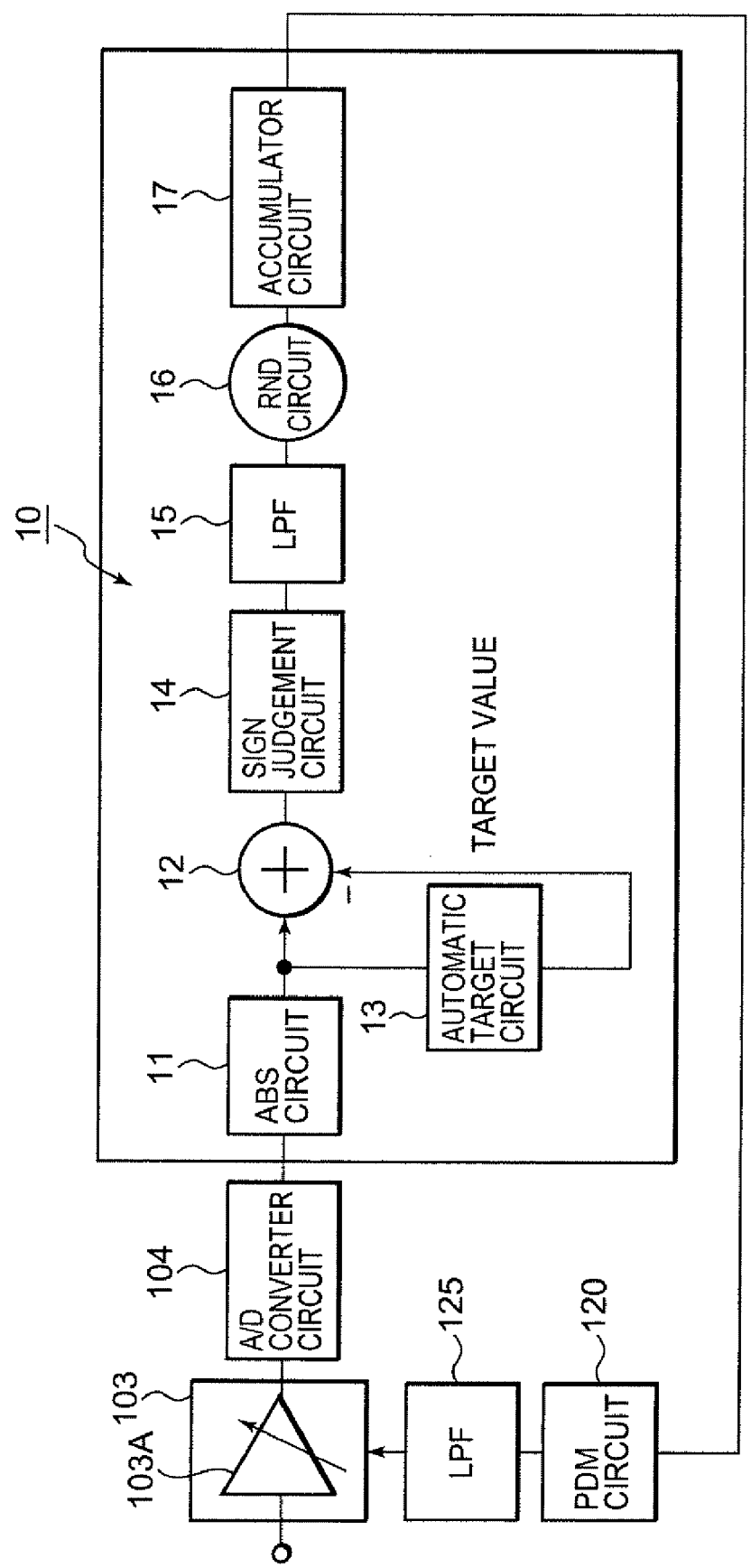
FIG. 2 is a block diagram showing an example of a structure of an automatic gain controller circuit mounted in an OFDM receiver.

For example, as shown in FIG. 2, the automatic gain controller circuit 10 may include an absolute value (ABS) circuit 11, a subtractor circuit 12, an automatic target circuit 13, a sign judgment (SGN) circuit 14, a low-pass filter 15, a rounding process (RND) circuit 16, an accumulator circuit 17.

In the automatic gain controller circuit 10, the ABS circuit 11 obtains an absolute value of the signal level value of the intermediate frequency signal by removing the sign of the intermediate frequency signal digitized by and supplied from the A/D converter circuit 104. The subtractor circuit 12 subtracts a target value supplied from the automatic target circuit 13 from the signal level value of the intermediate frequency signal changed into the absolute value by the ABS circuit 11 to detect a signed difference value. The SGN circuit 14 judges the sign of the signed difference value detected by the subtractor circuit 12, and supplies a 1-bit sign signal corresponding to the sign of the difference value to the accumulator circuit 17 via the low-pass filter 15 and rounding process (RND) circuit 16. The accumulator circuit 17 accumulates the sign signal supplied via the rounding process (RND) circuit 16 and outputs an accumulation output as an automatic gain controller (AGC) signal.

The AGC signal output from the automatic gain controller circuit 10 is supplied to a pulse density modulation (PDM) circuit 120 which outputs a PDM signal of a rectangular wave whose density changes with an amplitude of the AGC signal. The PDM signal is fed back via a low-pass filter 125 to a control terminal of a voltage controlled variable gain amplifier 103A constituting an intermediate frequency amplifier unit 103.

Figure 3:
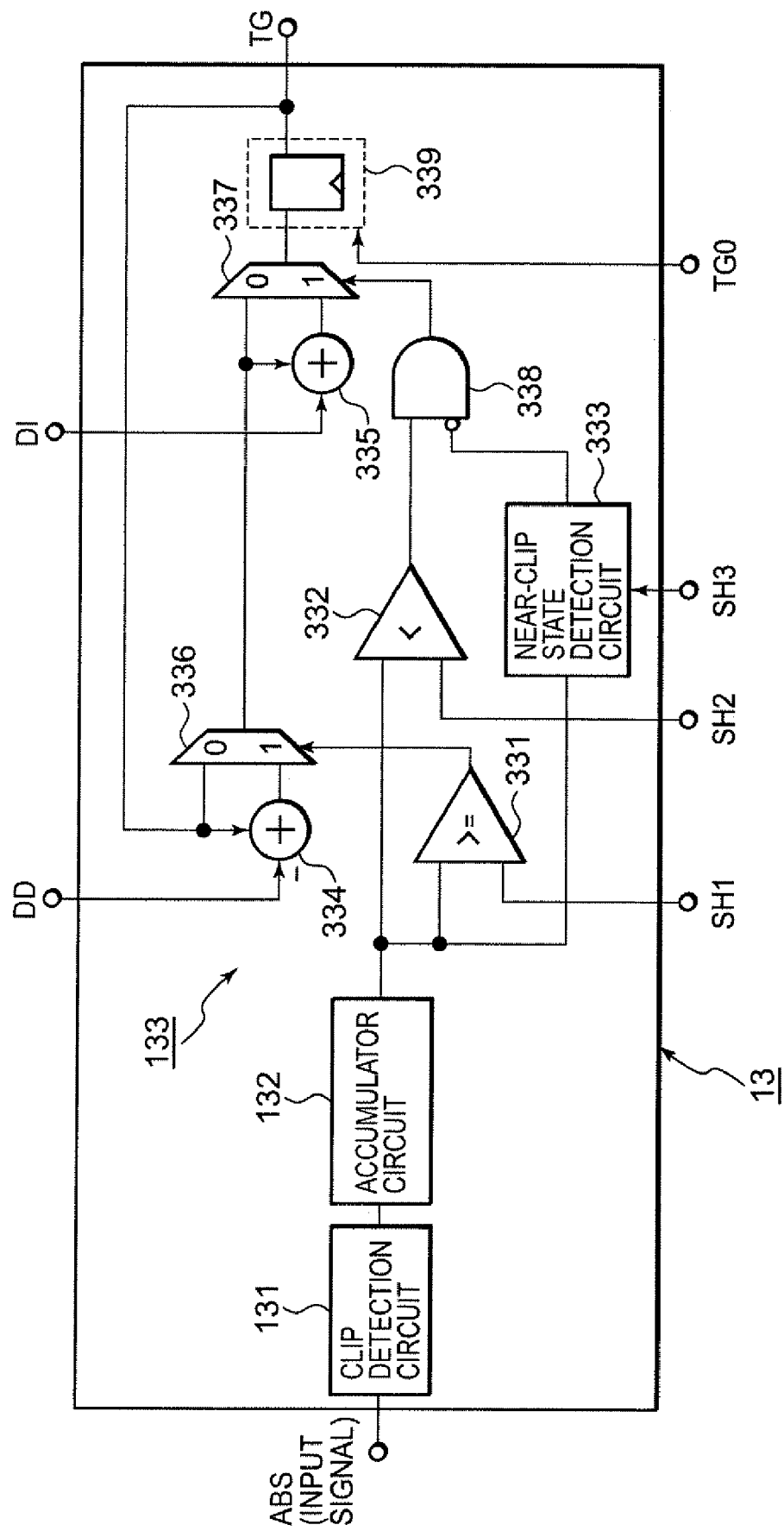
FIG. 3 is a block diagram showing an example of a structure of an automatic target circuit equipped in the automatic gain controller circuit.

For example, as shown in FIG. 3, the automatic target circuit 13 may include a clip detection circuit 131 to which the signal level value of the intermediate frequency signal changed to the absolute value by the ABS circuit 11 is input, an accumulator circuit 132 for accumulating a detection output from the clip detection circuit 131, and a target value decision circuit 133 to which an accumulation value from the accumulator circuit 132 is input.

Figure 4:
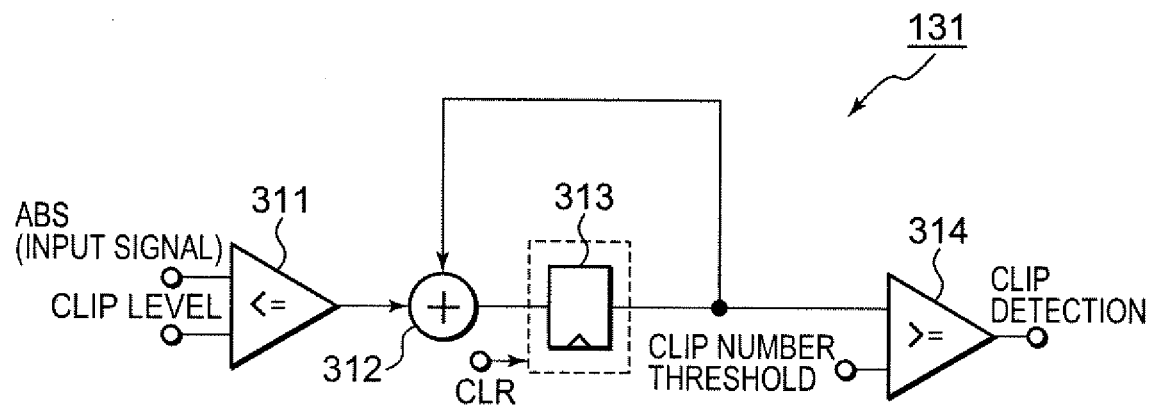
FIG. 4 is a block diagram showing an example of a structure of a clip detection circuit in the automatic target circuit.

For example, as shown in FIG. 4, the clip detection circuit 131 may include a clip level comparator 311, an adder 312, a register 313 and a clip number comparator 314.

In this clip detection circuit 131, the clip level comparator 311 compares a parameter clip level with the signal level value of the intermediate frequency signal changed to the absolute value by and supplied from the ABS circuit 11, and if the signal level value is larger, detects it as a transient clip. An output of the clip level comparator 311, i.e., a detection output of the transient clip, is added by the adder 312 to a detected number of transient clips stored in the register 313. The register 313 is cleared by a signal CLR at a predetermined period to store a cumulative addition value of the detected number of transient clips. The clip number comparator 314 compares a clip number threshold value with the detected number of transient clips stored in the register 313. If the detected number is equal to the clip threshold value or more, it is judged that a clip occurs during the corresponding period, and "1" is output as a clip detection. If the detected number is smaller than the threshold value, "0" is output.

The accumulator circuit 132 of the automatic target circuit 13 accumulates the detection output of the clip detection circuit 131, and inputs the accumulation output to the target value decision circuit 133.

The detection output of the clip detection circuit 131 may be input directly to the target value decision circuit 133. However, in order to monitor the signal level value in a longer period for dealing with slow fading, the detection output of the clip detection circuit 131 of the automatic target circuit is accumulated during a predetermined accumulation period by the accumulator circuit 132, and the accumulation output is input to the target value decision circuit 133.

The target value decision circuit 133 includes first and second comparators 331 and 332, a near-clip state detection circuit 333, a subtractor 334, an adder 335, first and second data selectors 336 and 337, an AND gate 338, a register 339.

In the target value decision circuit 133, the accumulation output of the accumulator circuit 13 is input to the first and second comparators 331, 332 and to the near-clip state detection circuit 333. The first comparator 331 is supplied with a clip threshold value SH1 for determining that the clip occurs, and the second comparator 332 is supplied with a non-clip threshold value SH2 for determining that the clip does not occur. The near-clip state detection circuit 333 is supplied with a near-clip threshold value SH3 for determining that the state is a near-clip state. The register 339 is supplied with a target initial value TG0. The target value output from the resister 339 is supplied to the subtractor 334 and first and second data selectors 336 and 337.

Further, the subtractor 334 is supplied with subtraction data DD indicating an amount for decreasing the target value, and the adder 335 is supplied with addition data DI indicating an amount for increasing the target value. The subtractor 334 subtracts the amount for decreasing the target value represented by the subtraction data DD from the target value TG output from the register 339, and inputs a subtraction output to the first data selector 336. The adder 335 adds the amount for increasing the target value represented by the addition data DI to the selection output by the first data selector 336, and inputs an addition output to the second data selector 337.

The first comparator 331 compares the accumulation output of the accumulator circuit 13 with the clip threshold value SH1, which is the value for determining that the clip occurs, and controls the first data selector 336 by the comparison output.

Under control of the comparison output of the first comparator 331, the first data selector 336 selects the substraction output from the register 339 if the accumulation output of the accumulator circuit 13 exceeds the clip threshold value SH1. The subtraction output is obtained by subtracting the amount for decreasing the target value, which is obtained by the subtractor 334, from the target value TG. If the accumulation output of the accumulator circuit 13 does not exceed the clip threshold value SH2, which is the value for determining that the clip does not occur, the first selector 336 selects the target value TG output from the resister 339. In this way, if the clip occurs, the target value TG is lowered. A selection output by the first data selector 336 is input to the adder 335 and the second data selector 337.

The second comparator 332 compares the accumulation output of the accumulator circuit 13 with the non-clip threshold value SH2, which is the value for determining that the clip does not occur, and controls the second data selector 337 by the comparison output via the AND gate 338.

The near-clip state detection circuit 333 detects the near-clip state, which is close but not equal to the clip-state, based on an accumulation output of the accumulator circuit 13 and the near-clip threshold value SH3, which is the value for determining the near-clip state.

Under control of the comparison output of the second comparator 332 via the AND gate 338, the second data selector 337 selects the addition output if the accumulation output of the accumulator circuit 13 does not exceed the clip threshold value SH2, which is the value for determining that the clip does not occur. The addition output is obtained by adding the amount for increasing the target value output from the adder 335 to the selection output of the first data selector 336. If the accumulation output of the accumulator circuit 13 exceeds the clip threshold value SH2, the second selector 337 selects the selection output of the first data selector 336. In this way, if the clip does not occur, the target value TG is increased. A selection output by the second data selector 337 is input to the register 339.

The amount for increasing or decreasing the target value may be an external parameter (amount for increasing or decreasing the target value) or a fixed value.

However, if the selection operation of the second data selector 337 is controlled only by the comparison output of the second comparator 332, the clip state and non-clip state are repeated. In order to avoid this, the near-clip state detection circuit 333 detects the near-clip state that is close but not equal to the clip state, and upon the near-clip state detection, the target value will not be increased. The near-clip state detection circuit 333 may be a circuit which, for example, subtracts a "1" from an output of the accumulator circuit 132 and compares the subtraction result with the near-clip threshold value. The near-clip state detection circuit 132 further outputs "1" if the subtraction result is larger.

The automatic gain controller circuit 10 having the structure described above may deal with the clip which occurs over a longer span of time, by having the automatic target circuit 13.

Figure 5:
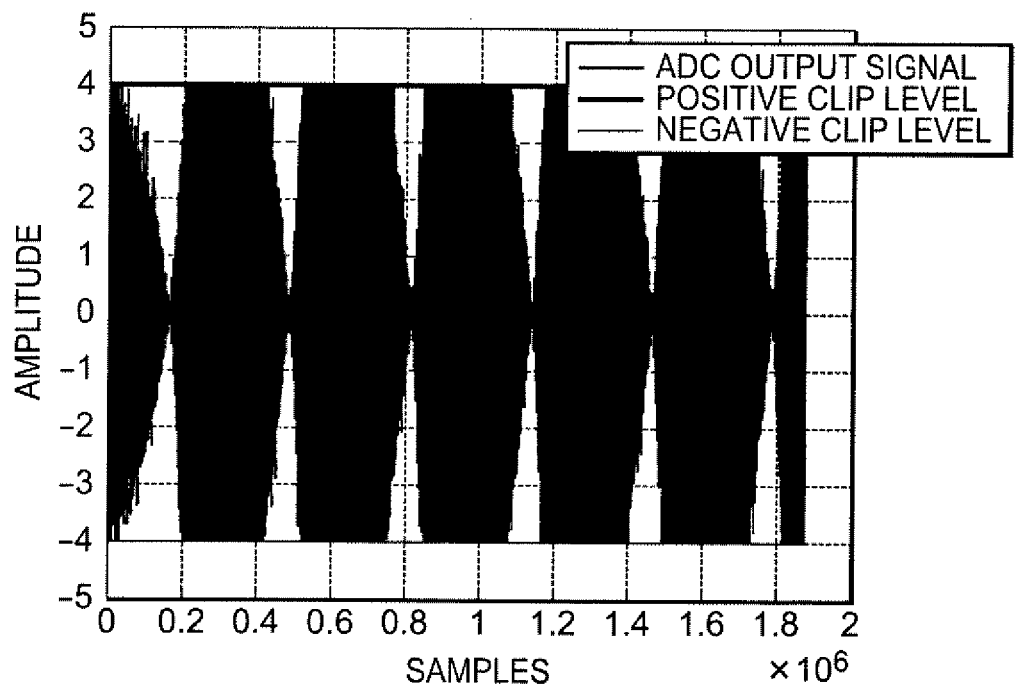
FIG. 5 is a schematic diagram showing clipping which occurs when a gain is increased greatly by typical automatic gain control.

In a reception environment of an OFDM signal at the OFDM receiver 100, the clip may occur with a shorter time period. Particularly at a flutter channel of 0 dB, a signal may disappear repetitively. In this case, a typical automatic gain control increases the gain greatly, and the clip occurs as shown in FIG. 5.

Figure 6:
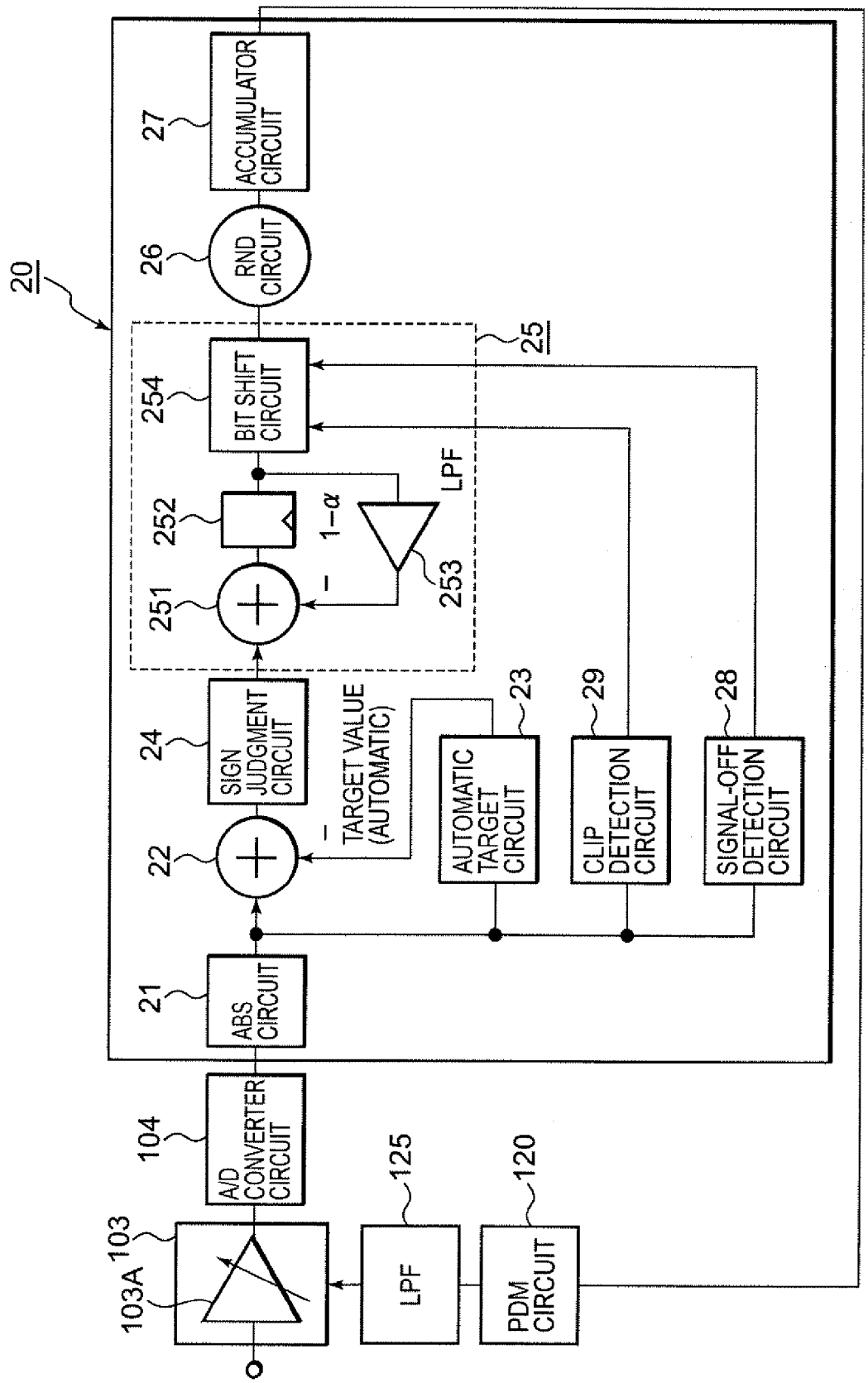
FIG. 6 is a block diagram showing another example of a structure of the automatic gain controller circuit in an OFDM receiver.

The OFDM receiver 100 used in the reception environment of this kind may use an automatic gain control circuit 20 having the structure such as shown in FIG. 6, in place of the above-described automatic gain controller circuit 10.

The automatic gain controller circuit 20 shown in FIG. 6 is an improved version of the automatic gain control circuit 10 to prevent the clip from occurring within a shorter time period. The automatic gain controller circuit 20 includes an absolute value (ABS) circuit 21, a subtractor circuit 22, an automatic target circuit 23, a sign (SGN) judgment circuit 24, a low-pass filter 25, a rounding process (RND) circuit 26, an accumulator circuit 27, a signal-off detection circuit 28, a clip detection circuit 29.

The absolute value (ABS) circuit 21, the subtractor circuit 22, the automatic target circuit 23, the sign (SGN) judgment circuit 24, the low-pass filter 25, the rounding process (RND) circuit 26, and the accumulator circuit 27 respectively of the automatic gain controller circuit 20 correspond to the absolute value (ABS) circuit 11, the subtractor circuit 12, the automatic target circuit 13, the sign (SGN) judgment circuit 14, the low-pass filter 15, the rounding process (RND) circuit 16, and the accumulator circuit 17 respectively of the automatic gain controller circuit 10, and the description of the constituent elements other than the low-pass filter 25 is omitted.

The low-pass filter 25 has an adder circuit 251 to which a 1-bit sign signal is supplied from the SGN circuit 24, a register 252 for storing an addition output value of the adder circuit 251, a weighting circuit 253 for weighting an addition output value of the adder circuit 251 by $(1-\alpha)$, and a bit shift circuit 254 to which supplied is the addition output value of the adder circuit 251 stored in the register 252. The addition output value of the adder circuit 251 stored in the register 252 is supplied back to the adder circuit 251 via the weighting circuit 253.

The low-pass filter 25 functions as a low-pass filter such that the adder circuit 251 conducts cumulative addition of the sign signal supplied from the SGN circuit 14 and weighted by $(1-\alpha)$ by the weighting circuit 253. The low-pass filter can change its pass-band width by controlling the bit shift circuit 254 which generates and outputs an AGC control signal. The AGC control signal is the addition output value of the adder circuit 251 stored in the register 252 and attenuated by $\frac{1}{2}^n$ through n-bit shift.

Figure 7:
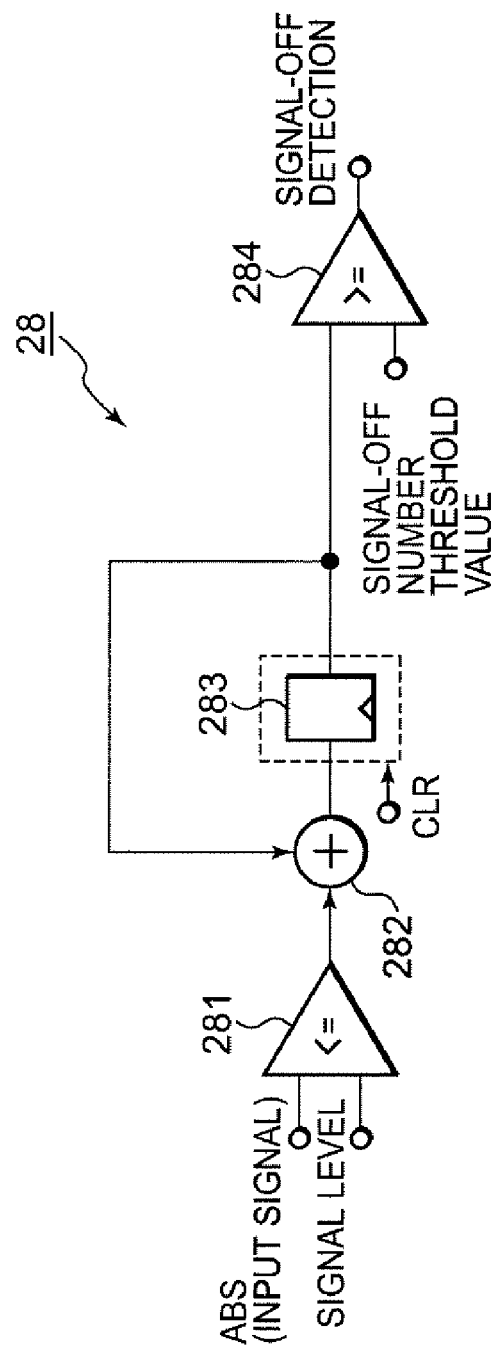
FIG. 7 is a block diagram showing an example of a structure of a signal-off detection circuit in the automatic gain controller circuit.
Figure 8:
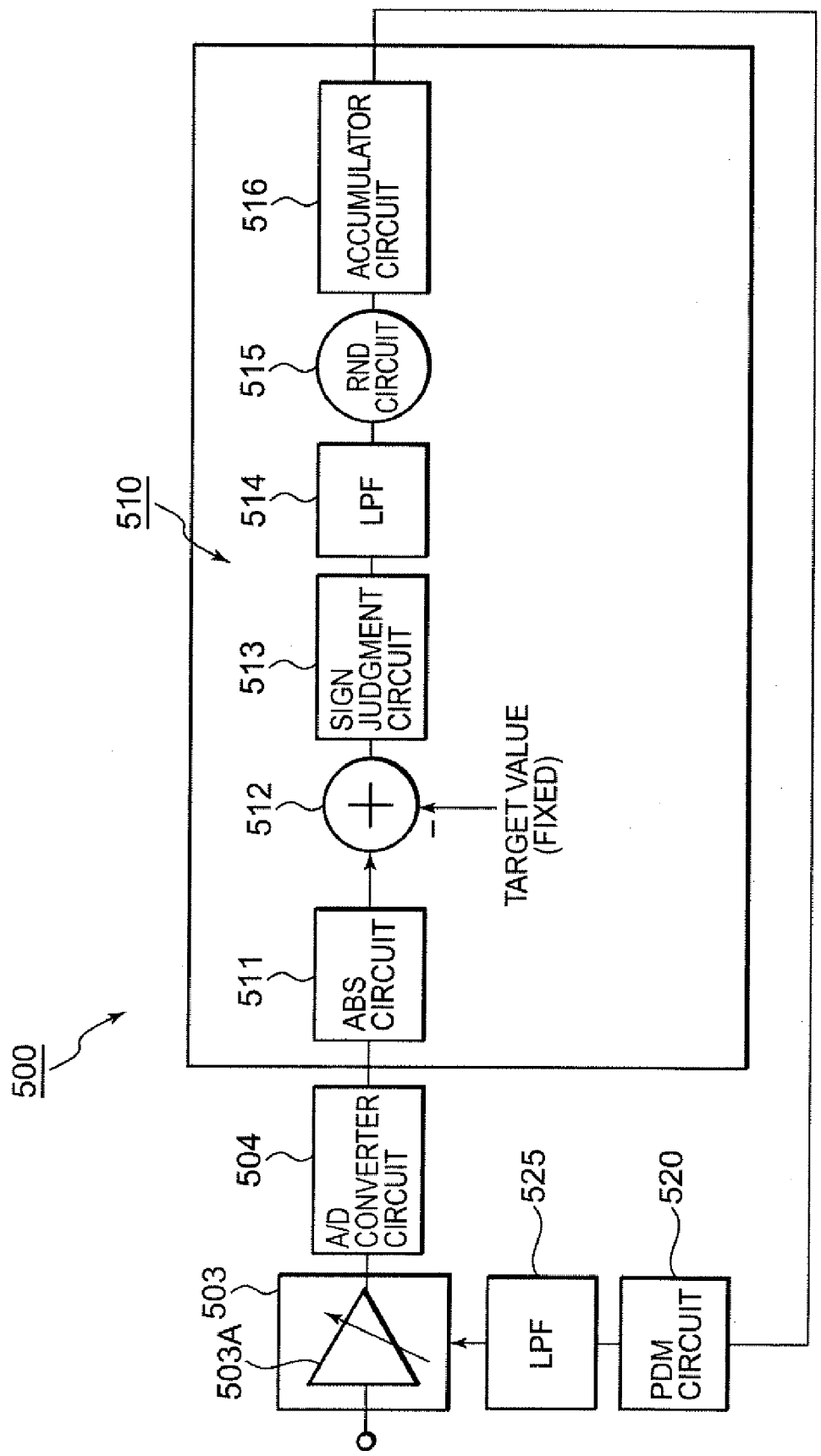
FIG. 8 is a block diagram showing an example of the structure of an automatic gain control circuit in an OFDM receiver of related art.
Figure 9A:
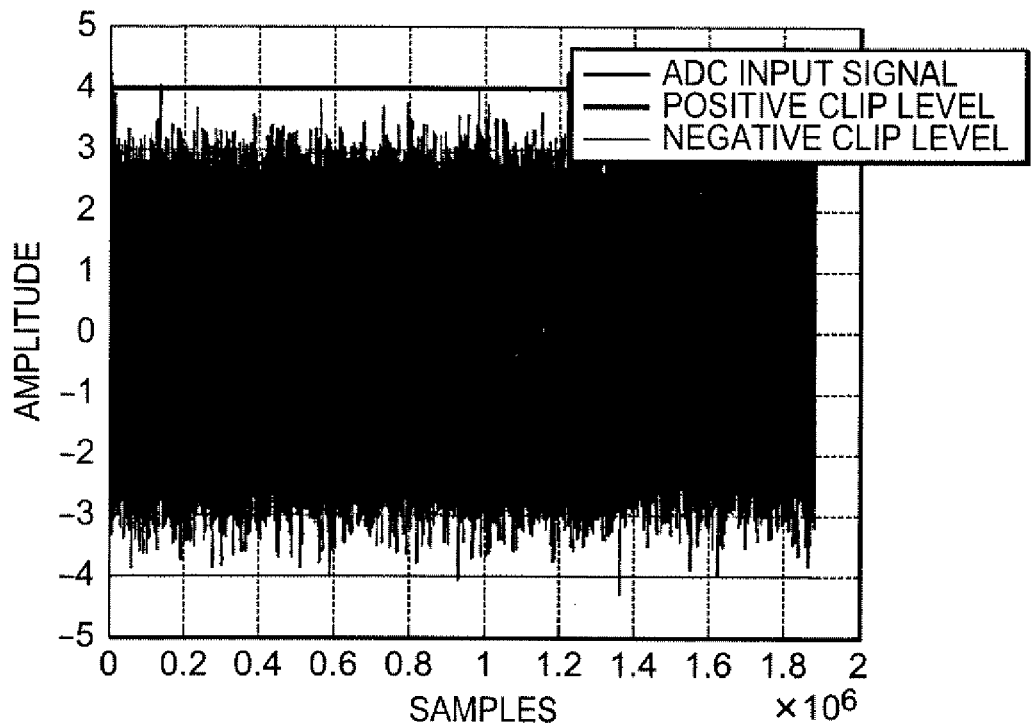
Figure 9B:
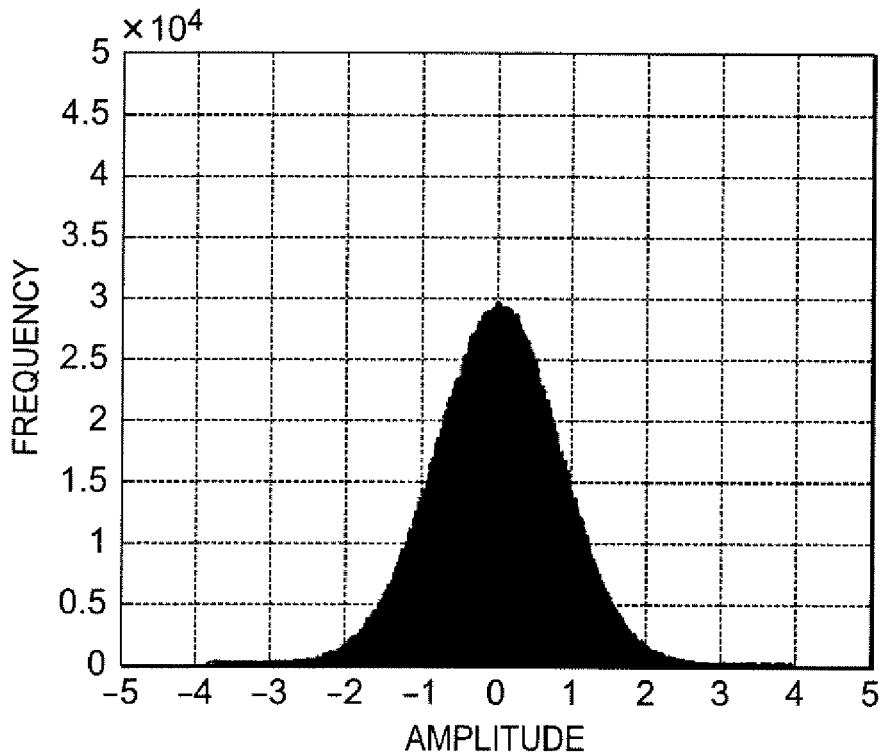
Figure 10A:
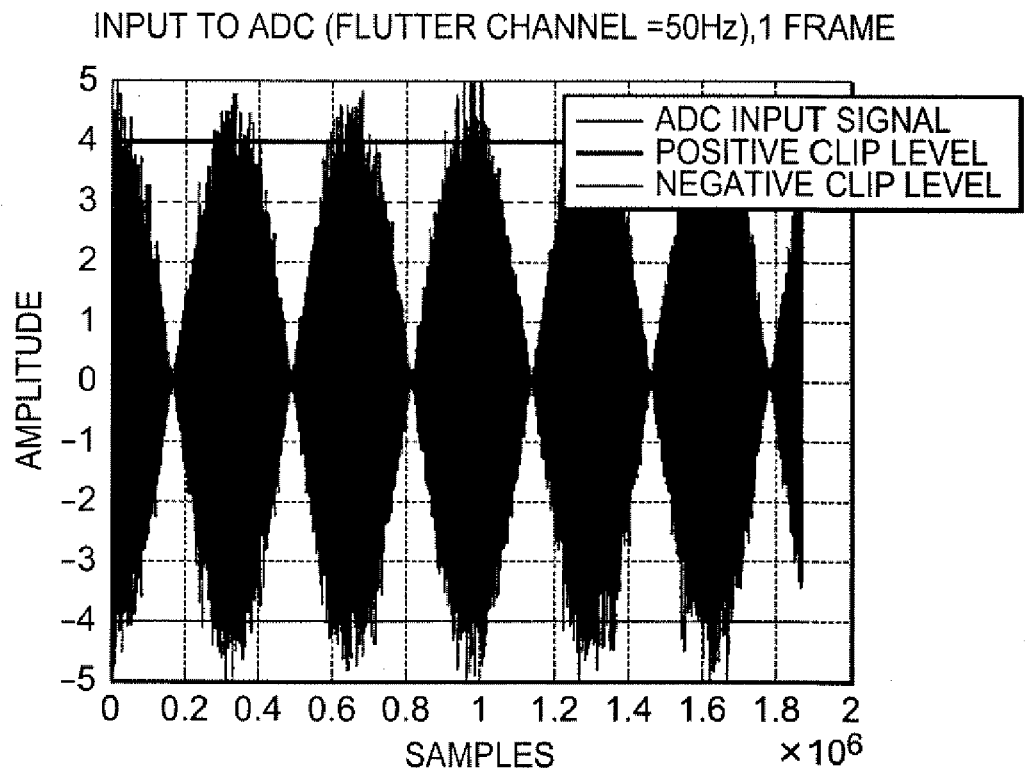
FIGS. 10A and 10B are schematic diagrams showing input signals and a signal distribution in a flutter channel.
Figure 10B:
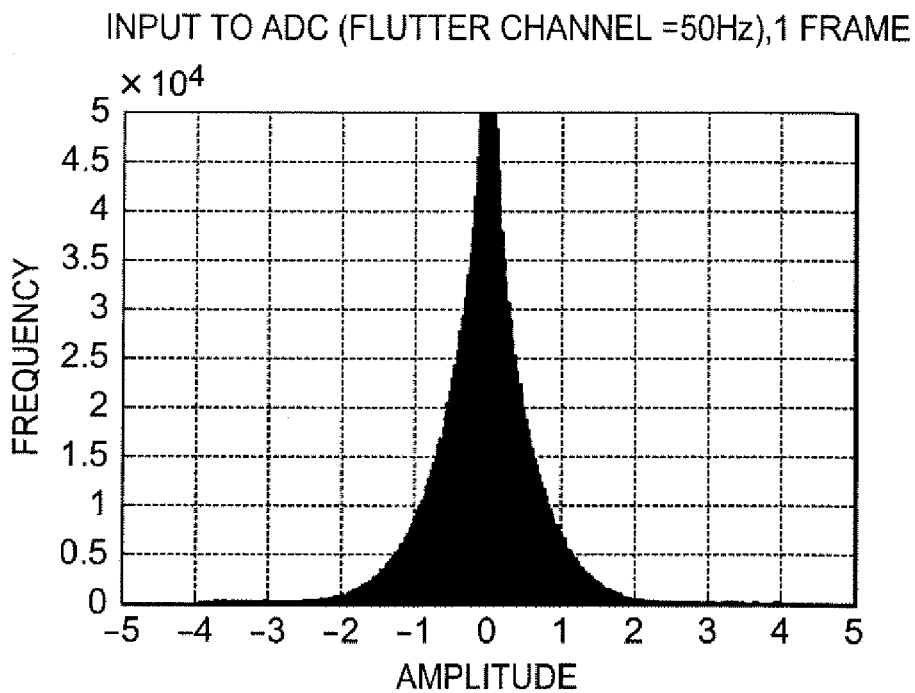
Figure 11A:
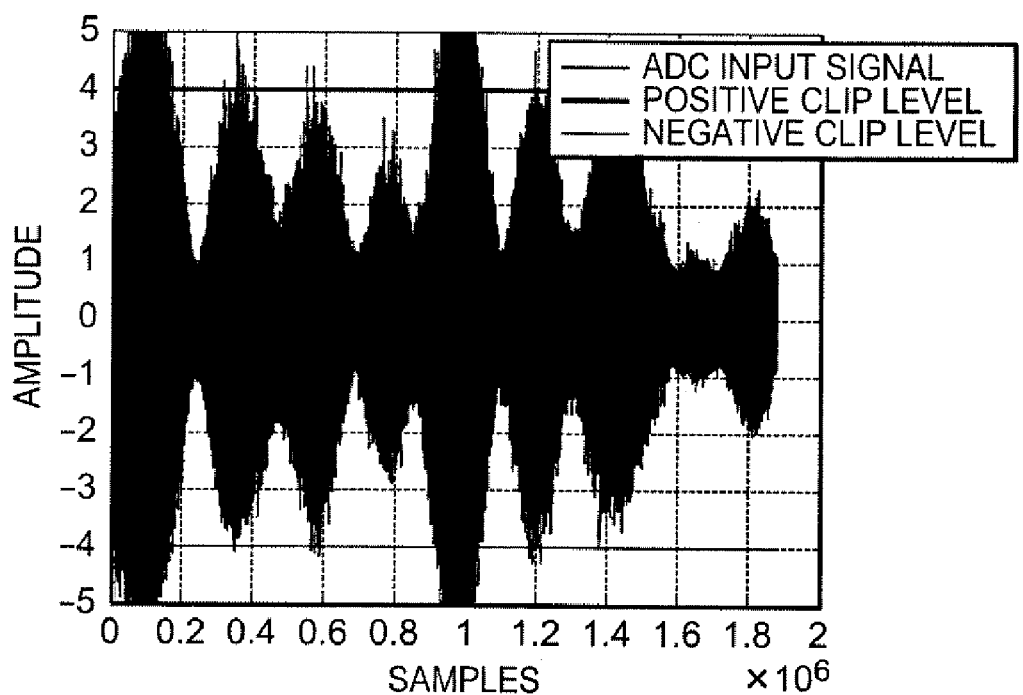
FIGS. 11A and 11B are schematic diagrams showing input signals and a signal distribution in a one-wave Rayleigh channel.
Figure 11B:
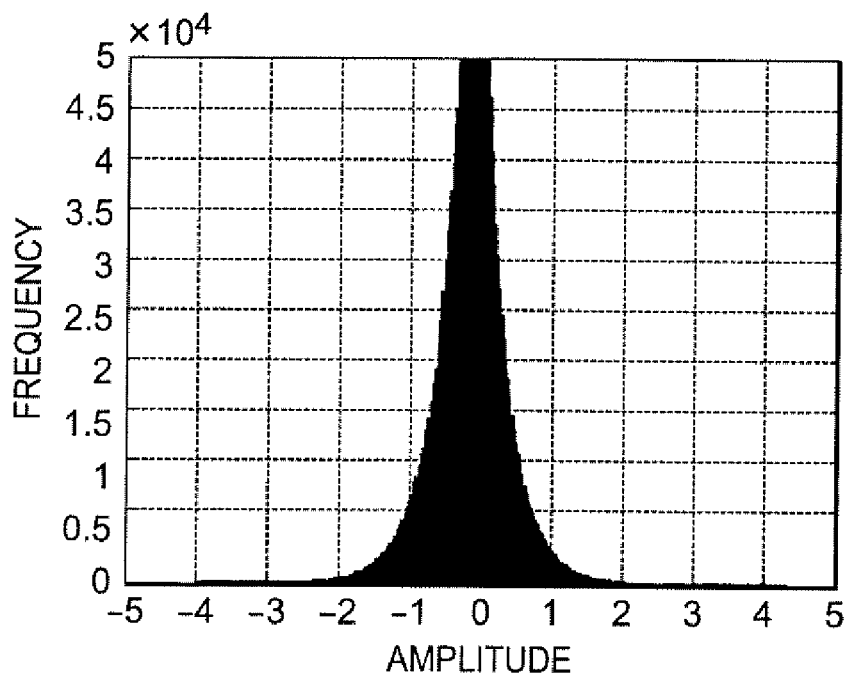

For example, as shown in FIG. 7, the signal-off detection circuit 28 includes a signal-off level comparator 281, an adder 282, a resister 283 and a signal-off number comparator 284.

In the signal-off detection circuit 28, the signal-off level comparator 281 compares a signal-off level with the signal level value of the intermediate frequency signal that is changed to the absolute value by and supplied from the ABS circuit 21, and detects a state of a signal-off if the signal level value is smaller. An output of the signal-off level comparator, i.e., a detection output of signal-off is added to the detected number of signal-off stored in the register 283 by the adder 282. The register 283 is cleared by a signal CLR at a predetermined period and stores a cumulative addition value of the detected number of signal-off. The signal-off comparator 284 compares a signal-off number threshold value with the detected number of signal-off stored in the register 283. If the number exceeds the signal-off number threshold value, it is judged the signal-off occurred in the subject period, and "1" is output as a signal-off detection signal. If the signal-off number is smaller than the threshold value, "0" is output. Namely, the signal-off detection circuit 28 outputs a signal-off detection signal which represents by "1" the period where the signal-off detected number exceeds the signal-off threshold value and by "0" the period where the signal-off detected number is smaller than the threshold value.

The clip detection circuit 29 is structured similar to the clip detection circuit 131 shown in FIG. 4. The clip detection circuit outputs the clip detection signal which represents by "1" the period where a detected number of transient clips in which the signal level value of the intermediate frequency signal, which is changed to the absolute value by and supplied from the ABS circuit 21, exceeds the clip number threshold value, and represents by "0" the period in which the detected number is smaller than the threshold value.

In the automatic gain controller circuit 20, the operation of the bit shift circuit 254 is controlled by each detection output of the signal-off detection circuit 28 and the clip detection circuit 29.

In other words, if the signal-off detection circuit 28 detects the signal-off state (no signal), a bit shift amount n of the bit shift circuit 254 is increased. In this way, in the signal-off state, a change amount of the AGC control signal is reduced so as to narrow the pass-band width, and to increase the gain of an output of the automatic gain controller circuit 20 by a small amount.

When the clip detection circuit 29 detects the clip, the bit shift amount n of the bit shift circuit 254 is reduced. In this way, when the clip occurs, the change amount of the AGC control signal is increased immediately so as to broaden the pass-band width, and to lower the output gain quickly.

In the OFDM receiver 100 equipped with the automatic gain controller circuit 20, the target level of AGC is changed at the mobile channel (particularly flutter channel) so as to reduce the clip of an AGC input signal, thereby enabling improvement of characteristics of a receiver at a succeeding stage. Furthermore, in an impulse noise channel, the clip state can be reduced, thereby enabling improvement of characteristics of a receiver at a succeeding stage. Furthermore, the clip caused by having ACI, CCI and other noised mixed in an OFDM signal can be reduced, thereby enabling improvement of characteristics of a receiver at a succeeding stage.

The present application contains subject matter related to Japanese Patent Application JP 2006-118319 filed in the Japanese Patent Office on Apr. 21, 2006, the entire content of which being incorporated herein by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An OFDM receiver for receiving and demodulating an orthogonal frequency division multiplexing (OFDM) signal, comprising:
    variable gain amplifier means for controlling a signal level of an intermediate frequency signal that is obtained from a reception signal by frequency-conversion; and
    an automatic gain controller circuit controlling a gain of the variable gain amplifier means;
    wherein the automatic gain controller circuit includes
    clip detection means for comparing a clip number threshold value with a detected number of transient clips in which a signal level of the intermediate frequency signal exceeds a parameter clip level, so as to detect a period where the detected number exceeds the clip number threshold value,
    accumulator means for accumulating a detection output of the clip detection means, and
    target value decision means to which an accumulation output of the accumulator means is supplied;
    wherein the target value decision means includes
        first comparison means for comparing the accumulation output of the accumulator means with a clip threshold value to judge if a clip occurs, and
        second comparison means for comparing the accumulation output of the accumulator means with a non-clip threshold value to judge whether a clip does not occur;
    wherein a target value for automatic gain control is adaptively determined by decreasing the target value by a predetermined amount in accordance with a comparison output of the first comparison means and by increasing the target value by a predetermined amount in accordance with a comparison output of the second comparison means.

2. An automatic gain controller circuit in an OFDM receiver for receiving and demodulating an orthogonal frequency division multiplexing (OFDM) signal, comprising:
    clip detection means for comparing a clip number threshold value with a detected number of transient clips in which a signal level of the intermediate frequency signal exceeds a parameter clip level, so as to detect a period where the detected number exceeds the clip number threshold value,
    accumulator means for accumulating a detection output of the clip detection means, and
    target value decision means to which an accumulation output of the accumulator means is supplied;
    wherein the target value decision means includes
        first comparison means for comparing the accumulation output of the accumulator means with a clip threshold value to judge if a clip occurs, and
        second comparison means for comparing the accumulation output of the accumulator means with a non-clip threshold value to judge whether a clip does not occur;
    wherein a target value for automatic gain control is adaptively determined by decreasing the target value by a predetermined amount in accordance with a comparison output of the first comparison means and by increasing the target value by a predetermined amount in accordance with a comparison output of the second comparison means.

3. The automatic gain controller circuit in an OFDM receiver according to claim 2, further comprising:
    near-clip state detection means for detecting a near-clip state where a state is close but not equal to a clip state based on an accumulation output of the accumulator means and a near-clip threshold value for determining the near-clip state;
    wherein the target value decision means inhibits increasing of the target value if the near-clip state detection means detects the near-clip state.

4. The automatic gain controller circuit in an OFDM receiver according to claim 2, further comprising:
    a low-pass filter capable of variably controlling a pass-band width through which an automatic gain control signal is allowed to pass; and
    control means for adaptively and variably controlling the pass-band width of the low-pass filter in accordance with the intermediate frequency signal.

5. The automatic gain controller circuit in an OFDM receiver according to claim 4,
    wherein the control means includes signal-off detection means for detecting if no reception signal exists, and if no reception signal exists, narrows the pass-band width of the low-pass filter to gradually change a control amount of automatic gain control.

6. The automatic gain controller circuit in an OFDM receiver according to claim 5,
    wherein the control means detects a period where the signal level of the intermediate frequency signal is clipped, and, if the clip occurs, the pass-band width of the low-pass filter is broadened and the control amount of automatic gain control is immediately changed.

7. An OFDM receiver for receiving and demodulating an orthogonal frequency division multiplexing (OFDM) signal, comprising:
    a variable gain amplifier controlling a signal level of an intermediate frequency signal that is obtained from a reception signal by frequency-conversion; and
    an automatic gain controller controlling a gain of the variable gain amplifier;
    wherein the automatic gain controller includes
    a clip detector comparing a clip number threshold value with a detected number of transient clips in which a signal level of the intermediate frequency signal exceeds a parameter clip level, so as to detect a period where the detected number exceeds the clip number threshold value,
    an accumulator accumulating a detection output of the clip detector, and
    a target value decision circuit to which an accumulation output of the accumulator is supplied;

wherein the target value decision circuit includes
a first comparator comparing the accumulation output of the accumulator with a clip threshold value to judge if a clip occurs, and
a second comparator comparing the accumulation output of the accumulator with a non-clip threshold value to judge whether a clip does not occur;
wherein a target value for automatic gain control is adaptively determined by decreasing the target value by a predetermined amount in accordance with a comparison output of the first comparator and by increasing the target value by a predetermined amount in accordance with a comparison output of the second comparator.

* * * * *